(12) United States Patent
Hall-Goulle et al.

(10) Patent No.: US 7,029,526 B2
(45) Date of Patent: Apr. 18, 2006

(54) PROCESS FOR MAKING GREEN PIGMENT COMPOSITIONS USEFUL FOR COLOR FILTERS AND LCD'S

(75) Inventors: Véronique Hall-Goulle, Dornach (CH); Takashi Deno, Nishinomiya (JP)

(73) Assignee: Ciba Specialty Chemicals Corporation, Tarrytown, NY (US)

( * ) Notice: Subject to any disclaimer, the term of this patent is extended or adjusted under 35 U.S.C. 154(b) by 27 days.

(21) Appl. No.: 10/491,815

(22) PCT Filed: Oct. 10, 2002

(86) PCT No.: PCT/EP02/11348

§ 371 (c)(1),
(2), (4) Date: Apr. 6, 2004

(87) PCT Pub. No.: WO03/035770

PCT Pub. Date: May 1, 2003

(65) Prior Publication Data

US 2004/0237842 A1    Dec. 2, 2004

(30) Foreign Application Priority Data

Oct. 19, 2001  (EP)  ................................. 01811024

(51) Int. Cl.
C09B 67/22 (2006.01)
G03F 7/00 (2006.01)

(52) U.S. Cl. ....................... 106/413; 106/410; 106/411; 106/412; 106/493; 106/494; 106/495; 106/496; 106/497; 106/498; 106/31.77; 106/31.78; 349/106; 430/7

(58) Field of Classification Search ................ 106/410, 106/411, 412, 413, 493, 494, 495, 496, 497, 106/498, 31.77, 31.78; 349/106; 430/7; 524/86, 87, 88
See application file for complete search history.

(56) References Cited

U.S. PATENT DOCUMENTS

| | | | |
|---|---|---|---|
| 4,077,972 A | 3/1978 | Baurecht et al. | 260/314.5 |
| 5,695,911 A | 12/1997 | Itoh et al. | 430/270.16 |
| 5,821,016 A | 10/1998 | Satoh et al. | 430/7 |
| 6,013,415 A | 1/2000 | Sakurai et al. | 430/281.1 |
| 6,100,312 A | 8/2000 | Suzuki et al. | 522/6 |
| 6,120,944 A | 9/2000 | Schädeli et al. | 430/7 |
| 6,596,446 B1 | 7/2003 | Wolf et al. | 430/7 |
| 2004/0034204 A1 | 2/2004 | Benkhoff et al. | 534/752 |

FOREIGN PATENT DOCUMENTS

| | | |
|---|---|---|
| CA | 1160402 | 1/1984 |
| EP | 0899288 | 3/1999 |
| EP | 0902327 | 3/1999 |
| JP | 10-160928 | 6/1998 |
| JP | 11-72616 | 3/1999 |
| JP | 11-256053 | 9/1999 |
| JP | 11-349840 | 12/1999 |
| JP | 2001-42117 A * | 2/2001 |

OTHER PUBLICATIONS

Chem. Abstr. 129:68963 for JP 10130547 (May 1998).
Chem. Abstr. 130:88289 for JP 11014825 (Jan. 1999).
Chem. Abstr. 131:163438 for JP 11209631 (Aug. 1999).
Patent Abstracts of Japan Publication No. 2001042117 (Feb. 2001).
Derwent Abstr. 97-555836/51 for JP 09269410 (Oct. 1997).
Chem. Abstr. 129:68963 for JP 10130547 (May 1998).
Chem. Abstr. 130:88289 for JP 11014825 (Jan. 1999).

* cited by examiner

Primary Examiner—Anthony J. Green
(74) Attorney, Agent, or Firm—Joseph C. Suhadolnik

(57) ABSTRACT

The invention pertains to the field of green color filters and LCDs. It has been found that pigments with surprisingly improved coloristic, chemical and physical properties are obtained by salt-kneading a halogenated phthalocyanine pigment together with a yellow pigment of the disazo condensation, barbituric acid or azoquinolone series. The process takes place in the presence of an organic liquid and in the absence of binder or optionally in the presence of a relatively small amount of binder. Claimed are the process itself as well as the green pigment composition obtained by the process and compositions comprising it.

12 Claims, No Drawings

PROCESS FOR MAKING GREEN PIGMENT COMPOSITIONS USEFUL FOR COLOR FILTERS AND LCD'S

The invention pertains to the field of green colour filters and LCDs. It has been found that pigments with surprisingly improved coloristic, chemical and physical properties are obtained by salt-kneading a halogenated phthalocyanine pigment together with a yellow pigment of the disazo condensation, barbituric acid or azoquinolone series. The process takes place in the presence of an organic liquid and in the absence of binder or optionally in the presence of a relatively small amount of binder.

No green pigment was known hitherto which fulfills alone the rigorous requirements of the international specifications for colour filters (computers, NTSC, PAL, SECAM, for example target area $x \geqq 0.31/y \geqq 0.47/Y \approx 75$). For this reason, it is usual in the field to manufacture green compositions for colour filters by dispersing a yellow and a blue or green pigment together in a solvent or binder. However, this process is extremely difficult to control; though many special methods and compositions have been proposed to improve it, they all depend very much on the pigments, solvents, binders and methods chosen. Each colour of blue, red and green in practice requires an entirely different approach.

Moreover, both the colour point (usually defined in the CIE 1931 x,y chromaticity diagram) and especially a transparency as high as possible cannot be matched in an entirely satisfactory manner yet.

EP-A-0 899 288 discloses a dispersion process by milling Pigment Green 7 with a resin (this and all following pigment designations refer to the Colour Index).

Compositions for colour filters are disclosed in U.S. Pat. No. 5,821,016, wherein mixtures of Pigment Green 7, 36 or 37 and Pigment Yellow 83 or 139 are first dispersed in a solvent. The ratio of Pigment Green 36 to Pigment Yellow 83 is 11:4 in an example.

EP-A-0 902 327 and U.S. Pat. No. 6,013,415 disclose radiation sensitive compositions made by dispersing in polymeric binder systems Pigment Green 36 and Pigment Yellow 83 (83:17), respectively Pigment Green 36 and Pigment Yellow 150 (60:40) or Pigment Green 7 and Pigment Yellow 83 (65:35).

Further radiation sensitive coloured compositions comprising amongst other mixtures such of Pigment Green 7, 36 or 37 with Pigment Yellow 139, 150 or 185 are disclosed in U.S. Pat. No. 6,100,312.

JP-A-10/160928 discloses a coating composition for green colour filters with high transmittance, comprising mixtures of Pigment Green 36 with Pigment Yellow 150 or 185 (2:1–10:9) and obtained from a powdery pigment made by finely dispersing the pigments in a solid resin.

JP-A-11/072616 discloses light sensitive compositions comprising quinophthalones such as Pigment Yellow 138, also in combination with Pigment Green 7 or 36 and optionally Pigment Yellow 93, 139 and 150. In an example, Pigment Green 36 and Pigment Yellow 93 are used in a weight ratio of 48:52.

JP-A-11/256053 and JP-A-11/310716 disclose green resin compositions comprising a green pigment and Pigment Yellow 138, respectively Pigment Yellow 185, dispersed therein. The pigments and a binder are first dispersed together in a solvent.

JP-A-11/349840 discloses colour pastes with reduced chloride content comprising Pigment Green 7, Pigment Green 36, Pigment Green 37, Pigment Yellow 93, Pigment Yellow 95, Pigment Yellow 138 or Pigment Yellow 139.

JP-A-2001/042117 discloses green compositions for colour filters produced by first salt-kneading Pigment Yellow 138, then dispersing it in the compositions together with Pigment Green 36 and optionally up to 20% by weight of Pigment Yellow 150. It is expressly mentioned that too finely kneaded Pigment Yellow 150 would decrease the green composition's dispersion stability.

Finally, WO-98/45756 discloses highly transparent coloured compositions useful in colour filters, comprising amongst others disazo yellow and amino-substituted phthalocyanine pigments (chosen according to their symmetry or asymmetry). The particles are extremely fine. However, the technology of the examples requires the pigments to be transformed reversibly into a "latent" soluble form, which is not possible with halogenated phthalocyanines having no amino or hydroxy groups. Alternatively, incorporating extremely fine pigments directly into the compositions instead of generating them in situ leads to unresolved rheology problems.

The instant invention provides a broad purpose green pigment suitable to be incorporated easily with excellent results into hitherto known or future compositions for colour filters, especially into radiation sensitive compositions. The skilled artisan will recognize that the instant pigments are a preferred alternative for transparent green colourants or colourant compositions of any kind, whereever such have been mentioned or otherwise appear to be desirable.

The transparency, chroma and hue are excellent as well as the chemical and physical properties, including but not restricted to high purity with low free or splittable chloride content, high light and heat fastness, and excellent rheology and dispersion stability.

The basic principle of salt-kneading is well-known in the field.

WO-00/56819 discloses salt-kneading of a diketopyrrolopyrrole together with a quinacridone pigment, without formation of a solid solution. The advantages are improved milling efficiency, high colour strength and a higher chroma due to less quinacridone.

WO-01/04215 discloses a two-step process wherein a pigment or mixture of pigments is first converted into a substantially amorphous fine-particle form, thereafter kneaded together with an organic liquid. Pigment Violet 23 and Pigment Red 254 of improved coloristic properties are obtained.

WO-01/09252 discloses salt-kneading of copper-free phthalocyanine pigments in the presence of water-soluble, neutral organic liquids having at least one oxy or oxo group in its molecule.

It has now been found that green pigments having improved properties especially in colour filters are obtained by a process for manufacturing a colorant composition in pigmentary form, comprising subjecting to a shearing force at −20 to 180° C. a mixture comprising:

a phthalocyanine of formula

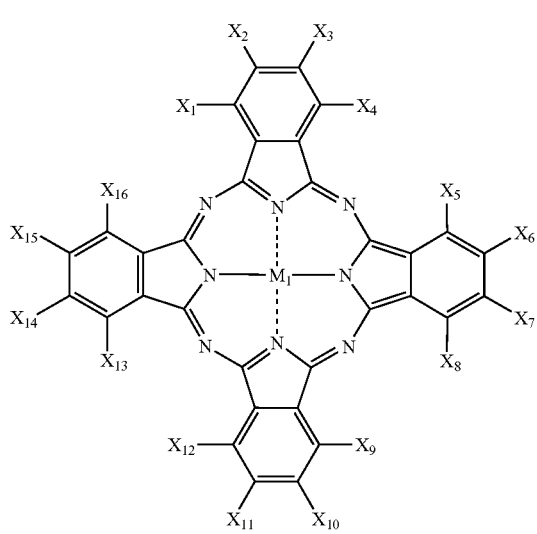

(I)

wherein $M_1$ is $H_2$, Cu, Zn, Fe, Ni, Pd, VO, MnO and TiO and $X_1$ to $X_{16}$ are H, Br or Cl, at least one of $X_1$ to $X_{16}$ being Cl; or a mixture thereof;

a compound or mixture of compounds selected from those of formulae (II), (III), (IV) and (V) and tautomers thereof,

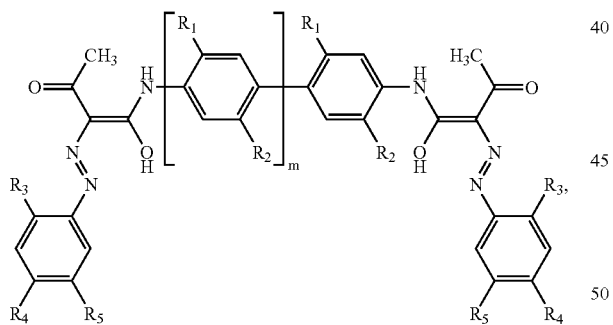

(II)

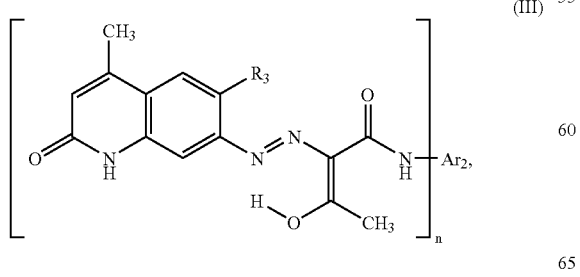

(III)

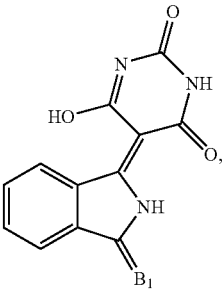

(IV)

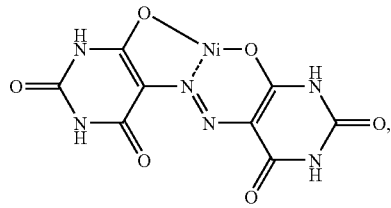

(V)

wherein m is 0 or 1, n is 1 or 2,

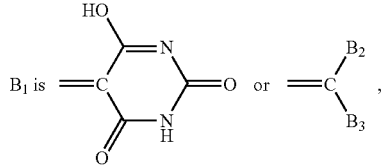

$B_2$ and $B_3$ are independently from each other CN, $CONR_6R_7$ or $CONR_6Ar_1$, $R_1$ and $R_2$ are independently from each other Cl, $R_6$ or $OR_6$, $R_3$, $R_4$ and $R_5$ are independently from each other H, F, Cl, $R_6$, $CF_3$, $OR_6$, $CONR_6R_7$, $CONR_6Ar_1$, $SO_2NR_6R_7$ or $SO_2NR_6Ar_1$, and $R_6$ and $R_7$ are H, $C_1$–$C_8$alkyl or $C_5$–$C_8$cycloalkyl, $Ar_1$ is phenyl, benzyl, biphenyl, naphthyl, phenoxyphenyl, phenylthiophenyl or carbazolyl which is unsubstituted or substituted by 1 to 5 substituents selected independently from the group consisting of F, Br, Cl, $R_6$, $CF_3$, $OR_6$, $COOR_6$, CN, $CONR_6R_7$ or $CONR_6Ar_3$, $Ar_2$ is phenyl, benzyl, biphenyl, naphthyl, phenoxyphenyl, phenylthiophenyl or carbazolyl when n is 1, respectively phenylen, biphenylen, naphthylen, oxydiphenyl, thiodiphenyl or carbazolylen when n is 2, each of which is unsubstituted or substituted by 1 to 5 substituents selected independently from the group consisting of F, Br, Cl, $R_6$, $CF_3$, $OR_6$, $COOR_6$, CN, $CONR_6R_7$, $CONR_6Ar_3$, $NR_6COR_7$, $NR_6COAr_3$, $NR_6SO_2R_7$, $NR_6SO_2Ar_3$, $NO_2$ or $COOM_2$, wherein $M_2$ is H, Na, Li, K, $Ca_{1/2}$, $Sr_{1/2}$, $Ba_{1/2}$, $Mg_{1/2}$, or a negative charge neutralised by $NH_4^+$ or primary, secondary, tertiary or quaternary ammonium, and $Ar_3$ is phenyl, benzyl, biphenyl, naphthyl, phenoxyphenyl, phenylthiophenyl or carbazolyl which is unsubstituted or substituted by 1 to 5 substituents selected independently from the group consisting of F, Br, Cl, $R_6$, $CF_3$, $OR_6$ or $NO_2$;

a grinding auxiliary; and an organic liquid.

Further components may be present, for example resins. However, the mixture subjected to a shearing force preferably consists of only the components mentioned above. Preferably, the shearing force is characterized by a shear gradient of from 300 to 20,000 $s^{-1}$.

Examples of compounds of formula (I) are Pigment Green 7, Pigment Green 36 and Pigment Green 37. Most suitable $M_1$ is Cu. Preferably, from 4 to 16 (most preferred from 8 to 16) of $X_1$ to $X_{16}$ are Cl, and none or from 1 to 8 of $X_1$ to $X_{16}$ are Br.

Examples of compounds of formulae (II), (IV) or (V) are Pigment Yellow 93, Pigment Yellow 94, Pigment Yellow 95, Pigment Yellow 128, Pigment Yellow 139, Pigment Yellow 150, Pigment Yellow 166 or Pigment Yellow 185. Preferably, $R_1$, $R_2$ and $R_3$ are independently from each other Cl or $CH_3$ (in particular $R_3$=Cl) and one of $R_4$ and $R_5$ is H and the other is $CONH_2$ or $CONHAr_1$ (in particular $R_4$=H and $R_5$=$CONHAr_1$). $R_6$ is preferably $CH_3$ or $C_2H_5$, most preferred $CH_3$. $Ar_1$ and $Ar_2$ are preferably phenyl substituted once or twice, $Ar_3$ is preferably phenyl unsubstituted or substituted once. $B_3$ is preferably CN, $B_3$ is preferably $CONR_6Ar_3$.

Examples of the instantly preferred compounds of formula (III) are disclosed in WO 02/34839 and CH-B-585247. More preferably, in formula (III) $R_3$ is Cl and n is 1. Most preferred are the compounds of examples 1–21 of WO 02/34839, particularly that of example 4. Further examples are known from U.S. Pat. No. 3,119,808 or U.S. Pat. No. 4,220,586.

The total amount of compounds of formulae (II), (III), (IV) and/or (V) is adequately 1–200% by weight, generally 3–120% by weight, preferably 5–90% by weight, most preferred 10–70% by weight, based on the amount of phthalocyanine (I).

Adequately, the shearing force should be sufficient with the help of the grinding auxiliary to break any colourant particles to a size less than 0.2 μm, preferably less than 0.12 μm; this is most suitably achieved by kneading the mass.

The resultant pigment has superior fastness properties and generally a specific surface area of from 60 to 180 $m^2/g$, preferably from 80 to 120 $m^2/g$ or from 120 to 150 $m^2/g$ (depending on the application purpose). The specific surface area may be determined, for example, using the BET method with nitrogen.

For the kneading, it is possible if desired to add inert additives known to the skilled worker, examples being binders, fillers, antifoams, dispersants and other additives, in any desired, known amounts, which are dependent on the inert additive and on the target effect and may range from 1 ppm up to the five-fold amount, based on the weight of the crude pigment. If binders are added, then depending on the amount thereof the specific surface area may fall to about half of the levels mentioned above.

A grinding auxiliary, as defined herein, means any material used to aid the reduction in size of the phthalocyanine of formula (I) and compounds of formulae (II), (III), (IV) and/or (V) from crude to pigmentary using attrition/grinding technology. Grinding auxiliary materials suitable for use in the process of the present invention include for example organic salts such as sodium formate or sodium acetate, organic compounds such as urea, aryl sulfonic acids (CA-B-695548), sugar, phthalimide, phthalic anhydride or particularly preferred crystalline inorganic salts, and mixtures thereof. The inorganic salt used is preferably aluminium sulfate, sodium sulfate, calcium chloride, potassium chloride or sodium chloride, which may if desired and available contain water of crystallization; particular preference is given to sodium sulfate, potassium chloride or sodium chloride.

Judiciously, the grinding auxiliary as well as the phthalocyanine of formula (I) and compounds of formulae (II), (III), (IV) and/or (V) are poorly soluble in the organic liquid; suitably, their solubility is ≦100 mg/l at 20° C., preferably ≦10 mg/l at 20° C., and with particular preference they are virtually insoluble at 20° C. (that is, no coloration of the upper liquid phase is seen after 1:1 dilution by the same liquid and centrifugation in a 10 mm inner diameter glass tube).

It is preferred to use a salt having an average particle size of from 5 to 200 μm, with particular preference a salt having an average particle size of from 10 to 50 μm. The grinding auxiliary is preferably soluble in water to the extent of at least 10 g/100 ml.

The organic liquid should be inert and preferably sufficiently hydrophilic in order that 98% by weight of it can be washed out from the filter cake with the 20-fold amount by weight of water, based on the amount of organic liquid. The organic liquid is most preferred soluble in water to the extent of at least 10 g/100 ml.

As organic liquid it is preferred to use a ketone, an ester, an amide, a sulfone, sulfoxide, a nitro compound, or a mono-, bis- or tris-hydroxy-$C_2$–$C_{12}$alkane compound which is substituted by 1 or 2 oxo groups and on one or more hydroxyl groups may be etherified with $C_1$–$C_8$alkyl or esterified with $C_1$–$C_8$alkylcarbonyl, or a mixture thereof. With particular preference, the ketone, ester, amide, sulfone, sulfoxide or nitro compound is an aliphatic or cycloaliphatic compound. It is also possible if desired to use other organic liquids, for example alcohols or glycols.

Judiciously, the organic liquid is neutral per se, although acidic or basic impurities in customary small amounts are not disruptive. Illustrative examples, but in no way limiting to the invention, of neutral organic liquids are triacetin, dimethylformamide, dimethylacetamide, N-methylpyrrolidone, ethyl methyl ketone, cyclohexanone, diacetone alcohol, butyl acetate, nitromethane, dimethyl sulfoxide, and sulfolane. Very particular preference is given to a ketone, amide, sulfone or sulfoxide, for example dimethyl sulfoxide, sulfolane, N-methylpyrrolidone, dimethylacetamide, dimethylformamide or, in particular, diacetone alcohol.

The temperature during kneading is judiciously from −20 to just below the boiling point of the organic liquid, in particular from about 0° C. up to about 100° C. and preferably from 10 to 60° C. The rotary speed should be adjusted, taking into account the cooling if necessary, in such a way that the kneaded composition is moved homogeneously under uniform shear, and the temperature does not rise above the temperature range according to the invention. Instances of local overheating or mechanical overloading should be avoided as far as possible. Outstanding results are obtained, for example, in a kneader of 5 l capacity at rotary speeds of from 50 to 150 rpm and kneading times of from 6 to 24 h, these figures being by no means limiting and it being possible for the rotary speeds to be lower in larger apparatuses, for example.

The proportion of organic liquid to inorganic salt is preferably from 1 ml:6 g to 3 ml:7 g, and the proportion of organic liquid to the overall weight of inorganic salt, phthalocyanine of formula (I) and compounds of formulae (II), (III), (IV) and/or (V) is from 1 ml:2.5 g to 1 ml:7.5 g. The weight ratio of the phthalocyanine of formula (I) and compounds of formulae (II), (III), (IV) and/or (V) to crystalline inorganic salt is preferably from 1:4 to 1:12.

Preferably, after kneading, the inorganic salt and the organic liquid are washed with water, especially demineralized water. Drying is conducted preferably at from −20 to 250° C./$10^{-1}$ to $10^5$ Pa, with particular preference from 25 to 100° C./$10^2$ to $10^5$ Pa or from 100 to 200° C./$10^4$ to $10^5$ Pa, with very particular preference around 80° C./$10^4$ Pa.

The phthalocyanine of formula (I) and compounds of formulae (II), (III), (IV) and/or (V) may be used in crude, pigmentary or even smaller particle size, for example also as individually inconspicuous particles (as seen under an optical microscope).

It has further been found that particularly advantageous results are obtained when using as starting materials the phthalocyanine of formula (I) and especially the compounds of formulae (II), (III), (IV) and/or (V) in a fine particle size with a surface area of at least 60 m$^2$/g, preferably at least 125 m$^2$/g. The compounds of formulae (II), (III), (IV) and/or (V) are particularly preferably used as individually inconspicuous particles, even better in a substantially amorphous phase.

The substantially amorphous nature of the compounds of formulae (I), (III), (IV) and/or (V) is recognized by the skilled worker in accordance with his or her general knowledge; for example, from the flat X-ray diffraction diagram. If use is made of the X-ray index defined in U.S. Pat. No. 4,253,839, then this index should be judiciously less than 4, preferably less than 2, with particular preference from 0 to 1.5.

A method which has proved particularly effective for producing individually inconspicuous particles and efficiently reducing the degree of crystallinity is to subject the crude pigment, together with a grinding auxiliary such as an inorganic salt, to very high acceleration such as the action of a rotor having a tangential speed of at least 10 m/s, so that by means of friction effects a temperature of at least 80° C. is reached.

Mixers known as high-speed mixers or heating mixers are known per se to the skilled worker. They comprise a static container with one or more rotors which may be operated at high rotational speeds. The construction of these apparatuses is designed in such a way that all of the material present in the container is continually in motion and each particle comes into recurrent contact with a rotor. The rotors may, for example, have the form of propellers, impellers or serrated wheels and the like. Apparatus of this kind is available, for example, from Diosna, Drais or Henschel, and the latest models achieve tangential speeds of up to about 40 m/s.

Preference is given to the use of a high-speed or heating mixer in which the tangential speed is from 15 to 40 m/s and the ratio of inorganic salt to crude pigment is from 1:1 to 1:12. A tangential speed of at least 30 m/s is particularly efficient. A tangential speed of above 40 up to about 60 m/s is entirely desirable for the practice of the invention but is unfortunately realizable only at great expense in terms of apparatus. A rotational speed of from 20 to 30 m/s is particularly economic, a ratio of inorganic salt to crude pigment used of from 1:4 to 1:8 is particularly preferred.

It has also been found that using relatively larger equipment not only enables a larger throughput, but also gives surprisingly better results. Thus, it is highly preferred to treat from about 10 kg to about 1000 kg of pigment per batch. The use of larger equipments (up to about 10'000 kg) would of course also be preferred, as well as the use of continuously working equipment (provided its design is such that the minimum dwell time of any pigment particle is long enough for the desired result to be obtained). Such apparatuses, however, require high investment costs.

The treatment time depends on the overall amount of substance, the rotational speed, and the cooling. In general, the treatment time is from 1 minute to 72 hours, preferably from 10 minutes to 5 hours, with particular preference from 30 minutes to 2 hours. The temperature rises preferably to 100–200° C., with particular preference to 120–170° C., most preferably from 130 to 160° C.

Suitable grinding auxiliaries are the same as described above. It has been found that surprisingly better results are obtained if a relatively coarse inorganic salt is used, preferably a salt having an average particle size (maximum of the particle size distribution) of from 200 μm to 1 mm.

Thus, the invention also pertains to an instant process comprising an additional preliminary step wherein the crude compounds of formulae (II), (III), (IV) and/or (V) are subjected, together with an inorganic salt, to very high acceleration such as the action of a rotor having a tangential speed of at least 10 m/s, so that by means of friction effects a temperature of at least 80° C. is reached and a fine particle size with a surface area of at least 60 m$^2$/g is obtained. The process is suitably done in the absence of liquids and compounds which melt or have a glass transition point ($T_g$) below the temperature maximally attained during dry-milling.

In another embodiment of the invention, the phthalocyanine of formula (I) is also dry pre-milled under the same conditions. Thus, the invention further pertains to an instant process wherein, in the additional preliminary step, also the phthalocyanine of formula (I) is subjected, together with an inorganic salt, to very high acceleration such as the action of a rotor having a tangential speed of at least 10 m/s, so that by means of friction effects a temperature of at least 80° C. is reached and a fine particle size with a surface area of at least 60 m$^2$/g is obtained.

The high-speed premilling is very especially advantageous in the case of compounds of formula (III). More details about this process are disclosed in WO-01/04215.

If desired, further pigments can be added during high-speed milling or at kneading time (from the beginning or at any time during kneading), for example Pigment Yellow 1, 3, 12, 13, 14, 15, 53, 62, 73, 74, 83, 93, 109, 110, 111, 119, 120, 129, 134, 147, 151, 154, 164, 168, 174, 175, 180, 181, 184, 188, 191:1, 194 or 199.

The addition of one or more further colorants such as above-mentioned yellows (or even other colours) is generally done only in small amounts, just sufficient to decrease too high a chroma to the desired x and y values. Such adjustment is easy given the instantly obtainable large colour gamut.

In addition or instead of other colorants, they may also be added known dispersants or rheology improvers, for example sulfonated or Mannich-substituted pigments, in particular such of the phthalocyanine type or colourless ones.

The instant process is simpler than previous ones and can be easily quality-controlled.

Green pigments obtained in accordance with the invention are notable in particular for high colour saturation (chroma) and excellent colour strength, transparency, rheology, dispersibility, and dispersion stability, as well as excellent patterning ability, contrast, brightness and rate of birefringence in colour filters. They have very attractive green shades with excellent fastness properties, good transparency and good gloss. Upon heating, they do not lead to highly undesirable apparition of free chloride ions.

The properties of green pigments obtained by the instant process are better than those of pigment compositions obtained by simply mixing or dispersing the components together. The colour and particles size distribution are more homogeneous, leading to a decreased number of missing pixels in LCDs. Even more surprisingly, the flocculation tendency of chlorinated phthalocyanines is significantly improved (occasionally even entirely prevented) and the dispersibility significantly improved, even without addition of dispersants or surface-active compounds. Furthermore, the transmittance in the area of about 530±20 nm is increased while at the same time the absorbance in the area of above 600 nm is increased, especially at about 640±20 nm. Moreover, the loss of colour strength and dispersibility problems associated with too fine particle size (over-milling) of the yellow pigments of formulae (II), (III), (IV) and particularly (V) can surprisingly be avoided, enabling thinner layers and consequently significant improvements in the field of LCDs.

It will be obvious for the skilled artisan to combine the instant green colour filter with known blue and red colour filters to obtain trichromatic full-colour systems.

At the present time, the structure of the products obtained by the instant process is not yet elucidated (composite particles or solid solution), though it is clear from the properties that they are different from simple mixtures or dispersions of chemically pure particles. Hence, the invention also pertains to a pigment composition obtainable by the instant process.

The pigment of the invention may be isolated and dried in pure form, in which case it is readily dispersible thereafter in plastics, paints and printing inks using, for example, a ball, bead or 3-roll mill. As a moist presscake, it can also be used directly to prepare pigment dispersions.

Dispersions of the pigments of the invention are ideally suited for example as concentrates for preparing printing inks which have excellent applications properties, especially an attractive green colour with high transparency and colour strength. The invention therefore additionally provides a printing ink or a printing ink concentrate comprising a pigment of the invention.

If desired, in order to improve the applications properties, customary additives such as binders may be added to the pigment of the invention prior to or during its isolation. Since the presence of additives, owing to incompatibilities, frequently results in a restriction of the possible fields of application, it is preferred to refrain from adding them. A very particular advantage which has been found is that pigment isolated without additives is outstandingly compatible with both aqueous and nonaqueous media, so that surprisingly good applications results can be obtained in both cases.

The invention also pertains to the use of the instant pigments in colour filters, which can themselves be used for example in electro-optical systems such as TV screens, liquid crystal displays, charge coupled devices, plasma displays or electroluminescent displays and the like. These may be, for example, active (twisted nematic) or passive (supertwisted nematic) ferroelectric displays or light-emitting diodes.

The instant green pigments will generally be used in the manufacture of colour filters as a dispersion in an organic solvent or water. There are several ways to manufacture these colour filters, which follow two mainstreams:
Direct patterning during applying;
Patterning after applying the pigment.

Direct patterning can be obtained by several printing techniques, such as impact (off-set, flexography, stamping, letterpress etc.) as well as non-impact (ink jet techniques).

Other direct patterning techniques are based on lamination processes, electronic discharging processes like electrodeposition and some special colour proofing methods, like the so-called Chromalin™ process (DuPont).

For impact printing techniques, the pigment may be dispersed in water or organic solvents by standard de-agglomeration methods (Skandex, Dynamill, Dispermat and the like) in the presence of a dispersant and a polymeric binder to produce an ink. Any dispersion technique known in the field, including the choice of solvent, dispersant and binder, can be used. The type of ink and its viscosity depend on the application technique and are well-known to the skilled artisan. Most usual binders, to which the invention is of course not limited, are (meth)acrylates, epoxies, PVA, polyimids, Novolak systems and the like as well as combinations of these polymers.

The ink dispersion then can be printed on all kind of standard printing machines. Curing of the binder system is preferably achieved by a heating process. The three colours can be applied at once or in different printing steps with intermediate drying and/or curing steps, for example one colour at the time in three printing steps.

Inks for use in ink jet, for example piezo or bubble jet, can be prepared likewise. They generally contain a pigment dispersed in water and/or one or a mixture of many hydrophilic organic solvents in combination with a dispersant and a binder.

For ink jet printing a standard ink jet printer can be used or a dedicated printer can be built in order to optimize for example the printing speed etc.

For lamination techniques, like thermal transfer and the like, a web system has to be made: The pigment is dispersed in a solvent or water with dispersant and binder and coated on a foil and dried. The pigment/binder system can be patternwise or uniformly transferred to a colour filter substrate with the help of energy (UV, IR, heat, pressure etc.). Depending on the technique used, the colourant for example may be transferred alone (dye diffusion or sublimation transfer), or the colourant dispersion may be entirely transferred including the binder (wax transfer).

For electrodeposition, the pigment has to be dispersed in water together with an ionized polymer. By means of an electrical current, the ionized polymer is deionized at the anode or the cathode and, being insoluble then, deposited together with the pigments. This can be done on patterned or patternwise shielded, by a photoresist, (transparent) photoconductors like ITO etc.

The Chromalin™ process makes use of a photosensitive material, deposited on a colour filter substrate. The material becomes tacky upon UV exposure. The so called 'toner', comprising a mixture or compound of pigment and polymer, is distributed on the substrate and sticks on the tacky parts. This process has to be done three to four times for R,G,B and eventually black.

Patterning after applying is a method based mostly on the known photoresist technology, wherein the pigment is dispersed in the photoresist composition. Other methods are indirect patterning with the help of a separate photoresist or lamination techniques.

The pigment may be dispersed into photoresists by any standard method such as described above for the printing processes. The binder systems may also be identical. Further suitable compositions are described for example in EP-B-654711, WO-98/45756 or WO-98/45757.

Photoresists comprise a photoinitiator and a polycrosslinkable monomer (negative radical polymerization), a material to crosslink the polymers itself (for example a photoacid generator or the like) or a material to chemically change the solubility of the polymer in certain developing media. This process, however, can also be done with heat (for example using thermal arrays or an NIR beam) instead of UV, in the case of some polymers which undergo chemical changes during heating processes, resulting in changes of solubility in the mentioned developing media. There is then no need for a photoinitiator.

The photosensitive or heat sensible material is coated on a colour filter substrate, dried and UV (or heat) irradiated, sometimes again baked (photoacid generators) and developed with a developing medium (mostly a base). In this last step only the non-exposed (negative systems) or only the exposed (positive systems) parts are washed away, giving the wanted pattern. This operation has to be repeated for all the colours used.

Photosensitive lamination techniques are using the same principle, the only difference being the coating technique. A photosensitive system is applied as described above, however on a web instead of a colour filter substrate. The foil is placed on the colour filter substrate and the photosensitive layer is transferred with the help of heat and/or pressure.

Indirect processes, with the above mentioned polymeric binders without a photosensitive component, make use of an extra photoresist, coated on top of the pigmented resist. During the patterning of the photoresist, the pigmented resist is patterned as well. The photoresist has to be removed afterwards.

More details about the manufacture of colour filters can be found in text books, reviews and other scientific articles. The skilled artisan will associate the instant invention with the use of any such known technique as well.

The colour filters of the invention contain the pigments of the invention judiciously in a concentration of from 1 to 75% by weight, preferably from 5 to 50% by weight, with particular preference from 25 to 40% by weight, based on the overall weight of the pigmented layer. The same values apply for printing ink concentrates, printing inks and the dry ink on printed items, too.

The invention therefore likewise provides a colour filter comprising a transparent substrate and a layer comprising from 1 to 75% by weight, preferably from 5 to 50% by weight, with particular preference from 25 to 40% by weight, based on the overall weight of the layer, of a pigment of the invention dispersed in a high molecular mass organic material. The substrate is preferably essentially colourless ($T \geq 95\%$ all over the visible range from 400 to 700 nm).

The binder may be any high molecular mass organic material as defined below, binder materials as described above being only examples.

The instant printing inks or photoresists for making colour filters contain the pigments of the invention judiciously in a concentration of from 0.01 to 40% by weight, preferably from 1 to 25% by weight, with particular preference from 5 to 10% by weight, based on the overall weight of the printing ink or photoresist.

The invention therefore likewise provides a composition for making colour filters comprising from 0.01 to 40% by weight, preferably from 1 to 25% by weight, with particular preference from 5 to 10% by weight, based on the overall weight of the composition, of a pigment of the invention dispersed therein.

The pigments of the invention are finally also suitable for colouring high molecular mass organic materials in the mass.

The high molecular mass organic material to be coloured in accordance with the invention may be natural or synthetic in origin and normally has a molecular weight in the range from $10^3$ to $10^8$ g/mol. The said material may, for example, comprise natural resins or drying oils, rubber or casein, or modified natural substances, such as chlorinated rubber, oil-modified alkyd resins, viscose, cellulose ethers or esters, such as cellulose acetate, cellulose propionate, cellulose acetobutyrate or nitrocellulose, but especially fully synthetic organic polymers (both thermosets and thermoplastics), as obtained by addition polymerization, polycondensation or polyaddition, examples being polyolefins such as polyethylene, polypropylene or polyisobutylene, substituted polyolefins such as polymers of vinyl chloride, vinyl acetate, styrene, acrylonitrile or acrylates and/or methacrylates or butadiene, and also copolymers of the abovementioned monomers, especially ABS or EVA.

From the series of the polyaddition resins and polycondensation resins, mention may be made of the condensates of formaldehyde with phenols, known as phenolic resins, and the condensates of formaldehyde with urea, thiourea and melamine, known as amino resins, the polyesters used as paint resins, and indeed both saturated resins, such as alkyd resins, and unsaturated resins, such as maleate resins, and also the linear polyesters and polyamides, or silicones.

The high molecular mass compounds mentioned may be present individually or in mixtures, as plastic masses or melts, which may if desired be spun into fibres.

They may also be present in the form of their monomers or in the polymerized state in dissolved form as film formers or binders for coating materials or printing inks, such as linseed oil varnish, nitrocellulose, alkyd resins, melamine resins, urea-formaldehyde resins or acrylic resins. When used in coatings, the instant pigments exhibit higher fastnesses than the chemically identical pigments of similar mean particle size or of similar surface area. However, their use in coatings is relatively limited due to their high transparency (for example in metallic finishes).

Pigmentation of the high molecular mass organic substances with the pigments of the invention takes place, for example, by mixing such a pigment, in the form if desired of masterbatches, into these substrates using roll mills, mixers or milling apparatus. In general, the pigmented material is subsequently brought into the desired ultimate form by techniques known per se such as calendering, compression moulding, extrusion, spreading, casting or injection moulding. In order to produce nonrigid mouldings or to reduce their brittleness it is often desirable to incorporate what are known as plasticizers into the high molecular mass compounds prior to their shaping. Examples of such plasticizers which may be used are esters of phosphoric acid, phthalic acid or sebacic acid. In the process of the invention, the plasticizers may be incorporated before or after the incorporation of the pigmentary colorant into the polymers. A further possibility, in order to obtain different hues, is to add fillers and/or other colouring constituents such as white, coloured or black pigments, and also effect pigments, in the particular desired amount to the high molecular mass organic materials in addition to the pigment compositions.

For pigmenting coating materials and printing inks, the high molecular mass organic materials and the pigments of the invention, alone or together with additives such as fillers, other pigments, siccatives or plasticizers, are finely dispersed or dissolved in, generally, an organic and/or aqueous solvent or solvent mixture. One possible procedure here is to disperse or dissolve the individual components alone, or else two or more together, and only then to combine all of the components.

A further embodiment therefore additionally provides mass-coloured high molecular mass organic material comprising
(a) from 0.05 to 70% by weight, based on the sum of (a) and (b), of a pigment of the invention, and
(b) from 99.95 to 30% by weight, based on the sum of (a) and (b), of a high molecular mass organic material.

Said material comprises both a ready-to-use composition or an article formed therefrom, and a masterbatch, in the form of granules, for example. If desired, the high molecular mass organic material coloured in accordance with the invention may also comprise customary additives, for example stabilizers. Of course, the high molecular mass organic material may result from polymerisation after, or partly after pigmentation.

A further embodiment therefore additionally provides a process for colouring high molecular mass organic material in the mass, which comprises incorporating therein or into a polymerisable precursor thereof a pigment of the invention, for example by mixing the high molecular mass organic material or polymerisable precursor with the pigment composition of the invention, optionally in the form of a masterbatch, in a manner known per se and processing this mixture.

The examples which follow illustrate the invention without restricting its scope (unless specified otherwise, "%" always relates to % by weight):

EXAMPLE 1

1 Kg pigment of structure

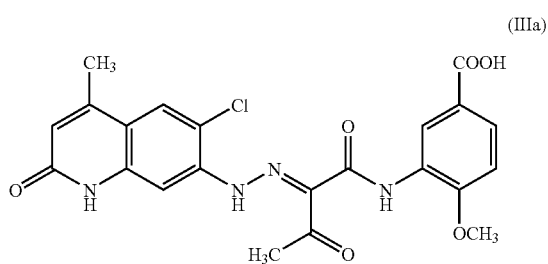

(IIIa)

and 4 Kg of sodium chloride are dry-milled in a 10 l mixer (FM 10 MB™, Henschel, Germany) for one hour at 3200 rpm (propeller diameter 220 mm).

EXAMPLE 2

A laboratory kneader with a capacity of 1 l is charged with 42 g of Pigment Green 36 (31 g/m$^2$; 3.40±0.05% Cl/61.0±0.5% Br; Irgalite® Green 6G, Ciba Specialty Chemicals Inc.), 90 g of the mixture from example 1, 168 g of sodium chloride and 70 ml of diacetone alcohol and the rotary speed is set to 100 rpm. The walls of the kneader are cooled to 30° C. so that the temperature in the mass does not exceed 40–45° C. After 8 hours, 150 ml of deionized water are added slowly, the resulting mixture is discharged onto a Büchner funnel and the material in the funnel is washed with water until the washing water is salt-free. The product is dried at 80° C./3·10$^3$ Pa for 15 hours, then sieved through a sieve with a mesh size of 0.4 mm.

EXAMPLE 3

In a 100 ml glass vessel containing 78.3 g of zircon ceramic beads, 2.52 g of the product from example 2, 0.28 g of Solsperse® 22'000 (Avecia), 0.56 g of Solsperse® 24'000 (Avecia) and 12.65 g of propylene glycol monomethyl ether acetate (MPA, CAS Reg. No. 108-65-6), these components are stirred at 20° C. with a Dispermat at 1000 rpm for 10 minutes and at 3000 rpm for 180 minutes. Following the addition of 5.45 g of acrylic polymer binder (35% solution in MPA) at room temperature, stirring is continued at 3000 rpm for 30 minutes. After the beads have been separated off, the dispersion is diluted with an equal amount of MPA. A glass substrate (Corning Type 1737-F) is coated with this dispersion in a spin-coating apparatus and is spun at 1000 rpm for 30 s. The drying of the coat is carried out at 100° C. for 2 minutes and at 200° C. for 5 minutes on a hotplate. The coat thickness achieved is 0.284 μm. The transmission spectrum of this colour filter has a maximum at about 545 nm. The trichromatic coordinates (with F10 as backlighting, calculated for a layer thickness of 0.4 μm) are within the target area.

EXAMPLE 4

It is proceeded in close analogy to example 1, with the difference that 1 kg of Irgalite® Green 6G and 4 kg of special salt are dry-milled in a Henschel mixer for one hour at 3200 rpm.

EXAMPLE 5

It is proceeded in close analogy to example 2, with the difference that 42 g of Pigment Green 36 and 168 g of sodium chloride are replaced by 210 g of the product of example 4.

EXAMPLE 6

It is proceeded in close analogy to example 3, with the difference that the product of example 2 is replaced by the product of example 5. The trichromatic coordinates (with F10 as backlighting, calculated for a layer thickness of 0.4 μm) are within the target area. At almost identical Y value, x and y are about 8% higher than in example 3.

COMPARATIVE EXAMPLE

It is proceeded in close analogy to example 3, with the difference that the product of example 2 is replaced by a 1.76 g of Pigment Green 36 and 0.76 g pigment of structure (IIIa). The trichromatic coordinates (with F10 as backlighting, calculated for a layer thickness of 0.4 μm) do not reach the target area. The spectrum is worse as compared with those of examples 3 and 6, both with respect to the transmittance in the area of about 530±20 nm and also with respect to the absorbance in the area of above 600 nm.

FURTHER EXAMPLES

Advantageous results are also obtained with Pigment Green 7 or 37 instead of Pigment Green 36, with Pigment Yellow 93, 94, 95, 128, 139, 150, 166 or 185 instead of (IIIa), and with other combinations of Pigment Green 7, 36 or 37 with Pigment Yellow 93, 94, 95, 128, 139, 150, 166 or 185, too.

The invention claimed is:

1. A process for manufacturing a colorant composition in pigmentary form, comprising subjecting to a shearing force sufficient to break any colourant particles to a size less than 0.2 μm at −20 to 180° C. a mixture comprising:

i) a phthalocyanine of formula

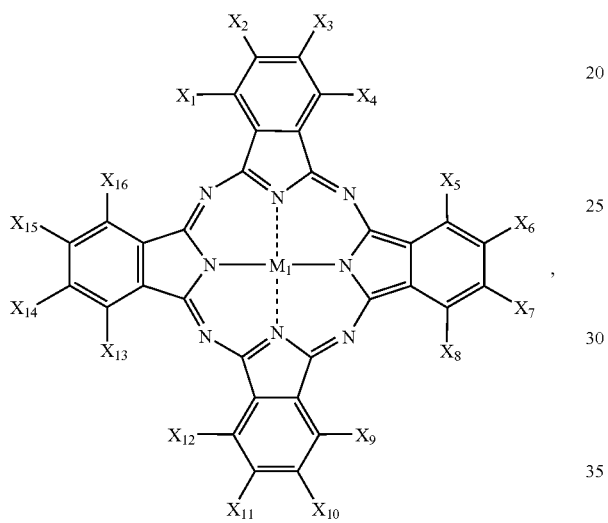
(I)

wherein $M_1$ is $H_2$, Cu, Zn, Fe, Ni, Pd, VO, MnO or TiO and $X_1$ to $X_{16}$ are H, Br or Cl, at least one of $X_1$ to $X_{16}$ being Cl; or a mixture thereof;

ii) a compound or mixture of compounds selected from those of formulae (II), (III), (IV) and (V) and tautomers thereof,

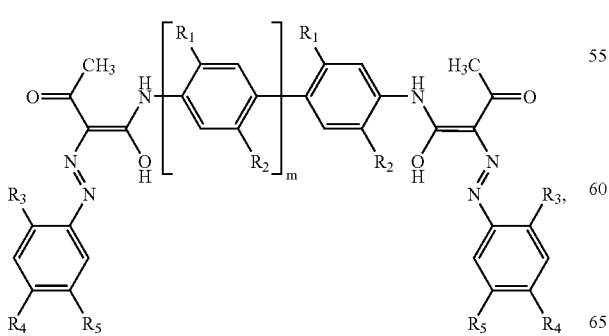
(II)

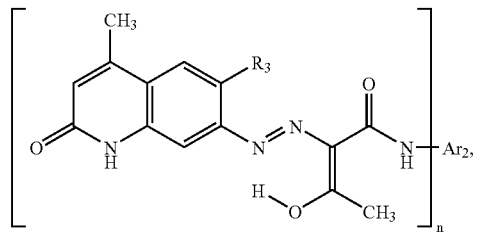
(III)

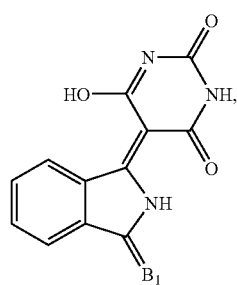
(IV)

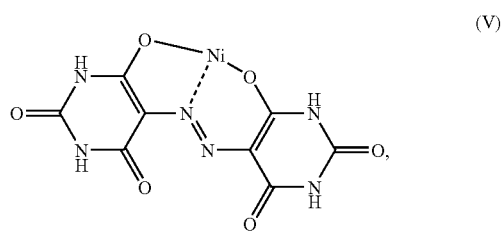
(V)

wherein m is 0 or 1, n is 1 or 2,

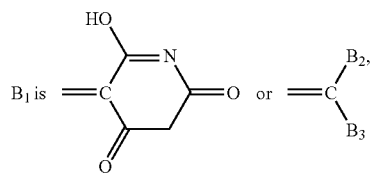

$B_2$ and $B_3$ are independently from each other CN, $CONR_6R_7$ or $CONR_6Ar_1$, $R_1$ and $R_2$ are independently from each other Cl, $R_6$ or $OR_6$, $R_3$, $R_4$ and $R_5$ are independently from each other H, F, Cl, $R_6$, $CF_3$, $OR_6$, $CONR_6R_7$, $CONR_6Ar_1$, $SO_2NR_6R_7$ or $SO_2NR_6Ar_1$, and $R_6$ and $R_7$ are H, $C_1$–$C_8$alkyl or $C_5$–$C_8$cycloalkyl, $Ar_1$ is phenyl, benzyl, biphenyl, naphthyl, phenoxyphenyl, phenyithiophenyl or carbazolyl which is unsubstituted or substituted by 1 to 5 substituents selected independently from the group consisting of F, Br, Cl, $R_6$, $CF_3$, $OR_6$, $COOR_6R_7$ and $CONR_6Ar_3$, $Ar_2$ is phenyl, benzyl, biphenyl, naphthyl, phenoxyphenyl, phenylthiophenyl or carbazolyl when n is 1, respectively phenylen, biphenylen, naphthylen, oxydiphenyl, thiodiphenyl or carbazolylen when n is 2, each of which is unsubstituted or substituted by 1 to 5 substituents selected independently from the group consisting of F, Br, Cl, $R_6$, $CF_3$, $OR_6$, $COOR_6$, CN, $CONR_6R_7$, $CONR_6Ar_3$, $NR_6COR_7$, $NR_6COAr_3$, $NR_6SO_2R_7$, $NR_6SO_2Ar_3$, $NO_2$, $SO_2NR_6Ar_3$, $SO_3M_2$ and $COOM_2$, wherein $M_2$ is H, Na, Li, K, $Ca_{1/2}$, $Sr_{1/2}$, $Ba_{1/2}$, $Mg_{1/2}$ or a negative charge neutralised by $NH_4^+$ to or primary, secondary, tertiary or quaternary ammonium, and $Ar_3$ is phenyl, benzyl, biphenyl, naphthyl, phenoxyphenyl, phenyithiophenyl or carbazolyl which is unsubstituted or substituted by 1 to 5 substituents selected independently from the group consisting of F, Br, Cl, $R_6$, $CF_3$, $OR_6$ and $NO_2$;

iii) a grinding auxiliary soluble in water to the extent of at least 10 g/100 ml and selected from the group consisting of organic salts, organic compounds, crystalline inorganic salts, and mixtures thereof; and iv) an organic liquid in which the grinding auxilary is soluble to the extent of less than or equal to 100 miligrams per liter at 20° C.

2. A process of claim 1, wherein the shearing force is characterized by a shear gradient of from 300 to 20,000 $s^{-1}$.

3. A process of claim 1, comprising an additional preliminary step wherein the compounds of formulae (II), (III), (IV) and/or (V) are subjected, together with an inorganic salt, to acceleration by the action of a rotor having a tangential speed of at least 10 m/s, so that by means of friction effects a temperature of at least 80° C. is reached and a fine particle size with a surface area of at least 60 $m^2/g$ is obtained.

4. A process of claim 3 wherein, in the additional preliminary step, the phthalocyanine of formula (I) is subjected, together with an inorganic salt, to acceleration by the action of a rotor having a tangential speed of at least 10 m/s, so that by means of friction effects a temperature of at least 80° C. is reached and a fine particle size with a surface area of at least 60 $m^2/g$ is obtained.

5. A process according to claim 1, wherein the organic salts of component iii are selected from the group consisting of sodium formate and sodium acetate; the organic compounds of components iii are selected from the group consisting of urea, aryl sulfonic acids, sugar, phthalimide and phthalic anhydride; and the crystalline inorganic salts of component iii are selected from the group consisting of aluminium sulfate, sodium sulfate, calcium chloride, potassium chloride and sodium chloride.

6. A process according to claim 1, wherein the grinding auxillary is a salt having an average particle size of from 5 to 200 μm.

7. A process according to claim 1, wherein the organic liquid of component iv is one or more compounds selected from the group consisting of ketones, esters, amides, sulfones, sulfoxides, nitro compounds, alcohols, glycols, and mono-, bis- or tris-hydroxy-$C_2$–$C_{12}$alkanes substituted by 1 or 2 oxo group wherein one or more hydroxyl groups may be etherified with $C_1$–$C_8$alkyl or esterified with $C_1$–$C_8$alkylcarbonyl.

8. A pigment as obtained by the process of claim 1.

9. A mass-coloured organic material with a molecular weight in the range of from $10^3$ to $10^8$ g/mol comprising
(a) from 0.05 to 70% by weight, based on the sum of (a) and (b), of a pigment according to claim 8, and
(b) from 99.95 to 30% by weight, based on the sum of (a) and (b), of a organic material with a molecular weight in the range of from $10^3$ to $10^8$ g/mol.

10. A material of claim 9, which is a colour filter or a print.

11. A printing ink for a printing ink concentrate comprising a pigment according to claim 8.

12. A colour filter according to claim 10, wherein the colour filter is further defined as being part of an electro-optical system wherein the electro-optical systems are TV screens, liquid crystal displays, charge coupled devices, plasma displays or electroluminescent displays.

* * * * *